United States Patent [19]

[11] 3,775,268

Fino et al.

[45] Nov. 27, 1973

[54] USE OF LEAD IN A NONORGANIC-CONTAINING COPPER PYROPHOSPHATE BATH

[75] Inventors: Ernest Fino, Waltham; William F. Moloney, Jr., Lowell; Emil Toledo, Natick, all of Mass.

[73] Assignee: The United States of America as represented by the Secretary of the Navy, Washington, D.C.

[22] Filed: Dec. 30, 1971

[21] Appl. No.: 214,447

[52] U.S. Cl. .................................. 204/52 R, 204/44

[51] Int. Cl. .................................. C23b 5/18

[58] Field of Search .................................. 204/44, 52 R

[56] References Cited

UNITED STATES PATENTS

| | | | |
|---|---|---|---|
| 2,886,500 | 5/1959 | Bride et al. | 204/44 |
| 2,793,990 | 5/1957 | Heymann et al. | 204/44 |
| 2,437,865 | 3/1948 | Stareck | 204/52 R |
| 2,763,606 | 9/1956 | Hespenheide et al. | 204/44 |
| 2,493,092 | 1/1950 | Stareck | 204/52 R |
| 2,841,542 | 7/1958 | Manquen | 204/52 Y |
| 2,989,448 | 6/1961 | France | 204/44 |
| 2,739,106 | 3/1956 | Hespenheide et al. | 204/44 X |

*Primary Examiner*—G. L. Kaplan
*Attorney*—R. S. Sciascia et al.

[57] ABSTRACT

A copper pyrophosphate bath for electroplating copper is provided which contains minor quantities of lead.

2 Claims, No Drawings

USE OF LEAD IN A NONORGANIC-CONTAINING COPPER PYROPHOSPHATE BATH

BACKGROUND OF THE INVENTION

This invention generally relates to a copper pyrophosphate bath used to electrolytically plate copper onto various substrates and more particularly to an inorganic copper pyrophosphate bath which also contains some lead.

Adhesive failure of electroplated solder on certain types of electroplated copper has recently been encountered by the printed circuit industry. This has been shown to occur particularly after the circuit board is exposed to elevated temperatures incurred in such processes as lamination, solder reflow, and thermal aging. Typical failures are exhibited by lack of adhesion of the solder when pressure sensitive adhesive tape is applied to the circuitry and pulled. A second type of failure has been the separation of solder joints from the copper pads with little or no externally applied stress.

Work done in researching the solder adhesion failure mechanism associates the failures with copper that is electroplated from baths containing organic leveling agents. These leveling agents are codeposited to some extent with the copper and are responsible for causing weak interfaces with the electroplated solder. A higher degree of solder adhesion failure has been noticed in baths in which these organic leveling agents and their electrolysis breakdown products have accumulated. Thus, research has been conducted to find copper pyrophosphate plating solutions which yield good quality products but which do not contain organic leveling agents which lead to solder adhesion failure.

SUMMARY OF THE INVENTION

Accordingly, one object of this invention is to provide a copper pyrophosphate bath from which copper can be electroplated.

Another object of this invention is to provide a copper pyrophosphate bath which does not include organic leveling agents.

Still another object of this invention is to provide a copper pyrophosphate bath from which copper can be electroplated which has a relatively low number of solder adhesion failures.

A still further object of this invention is to provide an additive for copper pyrophosphate baths which has the effect of extending the bright plating range of these baths without adding organic materials to the bath.

A still further object of this invention is to provide a method for improving the leveling and brightness of a copper pyrophosphate bath which has deteriorated from use.

These and other objects of this invention are accomplished by providing a copper pyrophosphate bath which contains small quantities of lead ion.

DESCRIPTION OF THE PREFERRED EMBODIMENT

The use of copper pyrophosphate baths to electroplate copper onto various substrates is well known in the prior art. Typically, one plates copper onto a substrate and then etches some copper off in order to obtain an article which finds use in a variety of electrical apparatus.

The typical copper pyrophosphate bath, such as the commonly used potassium copper pyrophosphate bath, depends on the formation of a complex compound $K_6Cu(P_2O_7)_2$. Thus, copper is present as the complex ion $Cu(P_2O_7)_2^{-6}$. Besides copper, these baths also contain ammonia ions to give satisfactory plating results. Additionally, organic additives such as citrates and nitrates are often added to level, refine grains, act as brighteners and to extend the limiting current density of the bath. In the prior art, the presence of lead was kept to an absolute minimum because it was believed that the presence of lead in the bath adversely affected the quality of the copper being plated.

However, as hereinbefore noted, the presence of organic materials has adversely affected the quality of the copper being plated. It has been found that if the organic materials are eliminated from the bath it is still possible to obtain very good quality copper plating if small quantities of lead are added to the bath. Thus, one obtains plated copper which does not have the deficiencies of the copper plated with baths which do contain organic materials and which additionally have a relatively smooth, shiny surface.

The quantity of lead ion that should be present in the typical copper pyrophosphate solutions of the prior art is from about 0.07 to about 0.4 weight per cent. Naturally, the lead ion should be added by adding an inorganic salt of lead to the bath. Among the lead salts which are preferred are lead carbonate, lead nitrate, lead sulfate, and any of the other simple lead salts with lead carbonate being the most preferred. The inclusion of lead ion in the bath extends the bright plating range much like the commonly used organic additives but unlike some of these additives, it does not introduce impurities which later cause loss of bond strength after exposure to high temperatures. The addition of lead to the copper pyrophosphate bath seems to afford a bright copper deposit over a wider range of current densities and with less stringent control over other operating parameters than do the organic additives. Thus, it is apparent that lead is an important leveling and brightening agent for this bath.

Although Applicants do not wish to be bound by this theory, it is believed that the process of plating copper from pyrophosphate baths first involves the plating of copper in the double layer. As copper in the double layer is depleted, the second constituent, lead, plates out for a very brief period of time before copper plating resumes. However, if the lead ion present exceeds about 0.4 weight per cent, it will completely deteriorate the bath.

EXAMPLE

A typical copper pyrophosphate bath which has been used to electroplate copper has the following composition:

specific gravity — 1.2 – 1.4
pH — 8.2 – 8.5
copper — 3.5 oz/gallon
ammonia, 29% — 1.75 oz/gallon
pyrophosphate:copper[1] — 7.5:1
current density — 25 – 35 asf
voltage — 2 – 5
lead carbonate — 0.25 percent by weight

[1]The pyrophosphate was added as potassium pyrophosphate and the ratio is a molar ratio.

As will be recognized by those skilled in the art, the various constituents of the pyrophosphate bath may vary over a fairly wide range. Since the use and compositions of pyrophosphate baths are well known in the art, it will suffice to say that the pH may vary from about 7.0 – 9.5 with 8.0 – 8.5 being the most preferred range, the copper concentration may be 2.0 – 5.0 oz/gallon with 3.0 – 4.0 oz/gallon being the most preferred; the ammonia concentration is determined by the pH, and the pyrophosphate:copper ratio may be 6:1 – 9:1 with 7:1 – 8:1 being the most preferred.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. In an aqueous inorganic copper pyrophosphate electroplating bath the improvement comprising:

including about 0.07 to about 0.4 weight percent lead ion in the bath, wherein said lead ion is present as a lead salt which is lead carbonate.

2. In the method of electroplating copper from an aqueous inorganic copper pyrophosphate bath the improvement comprising:

including in said bath about 0.07 to about 0.4 weight percent lead ion, wherein said lead ion is present as lead carbonate.

* * * * *